(12) United States Patent
Ogawa et al.

(10) Patent No.: US 6,270,267 B1
(45) Date of Patent: Aug. 7, 2001

(54) METHOD OF DEVELOPING PHOTOSENSITIVE RESIN PLATE AND DEVELOPING DEVICE

(75) Inventors: Nobuo Ogawa; Tsutomu Kojima, both of Fuji (JP)

(73) Assignee: Asahi Kasei Kabushiki Kaisha, Tokyo (JP)

(*) Notice: Subject to any disclaimer, the term of this patent is extended or adjusted under 35 U.S.C. 154(b) by 0 days.

(21) Appl. No.: 09/582,036

(22) PCT Filed: Dec. 22, 1998

(86) PCT No.: PCT/JP98/05808

§ 371 Date: Jun. 21, 2000

§ 102(e) Date: Jun. 21, 2000

(87) PCT Pub. No.: WO99/32939

PCT Pub. Date: Jul. 1, 1999

(30) Foreign Application Priority Data

Dec. 22, 1997 (JP) .................................... 9-353630
Apr. 2, 1998 (JP) ................................. 10-090046

(51) Int. Cl.[7] .................................... G03D 5/00
(52) U.S. Cl. .................. 396/604; 396/626; 396/627; 396/636
(58) Field of Search .................. 396/604, 611, 396/626, 627, 636; 134/64 P, 122 P, 902, 157, 24, 34, 64 R, 122 R; 118/52; 427/240; 430/30, 398–400, 311, 330

(56) References Cited

FOREIGN PATENT DOCUMENTS

| | | |
|---|---|---|
| 2558078 | 1/1984 | (FR) . |
| A2152398 | 8/1985 | (GB) . |
| A58-202444 | 11/1983 | (JP) . |
| U61-41250 | 3/1986 | (JP) . |
| A63-144355 | 6/1988 | (JP) . |
| A4249259 | 9/1992 | (JP) . |
| WO9606382 | 2/1996 | (WO) . |

Primary Examiner—D. Rutledge
(74) Attorney, Agent, or Firm—Birch, Stewart, Kolasch & Birch, LLP

(57) ABSTRACT

A method of developing a photosensitive resin plate comprising, in order to greatly prolonging the service life of a developing solution and increase the number of plates that can be developed using a specified amount of the developing solution, supplying under circulation a developing solution (2) stored in a developer tank (1) and containing a surfactant to the surface of the tank (1), characterized in that a porous sheet (6) impregnated with a defoamer is disposed on or in the vicinity of the liquid surface of the developer tank (1) so that the developing solution (2) dropped from the surface of the photosensitive resin plate (5) passes through the porous sheet (6).

5 Claims, 4 Drawing Sheets

METHOD OF DEVELOPING PHOTOSENSITIVE RESIN PLATE AND DEVELOPING DEVICE

This application is the national phase under 35 U.S.C. § 371 of PCT International Application No. PCT/JP98/05808 which has an International filing date of Dec. 22, 1998, which designated the United States of America.

TECHNICAL FIELD

The present invention concerns a method of developing a photosensitive resin plate and a developing apparatus used for the method.

BACKGROUND ART

As a developing method conducted in plate making of aqueous development type photosensitive resin plates, there has been known, for example, a method of spraying an aqueous developing solution comprising a surfactant as a main ingredient to a plate surface of a photosensitive resin plate after the completion of exposure and/or bringing a brush in contact with the plate surface by way of a developing solution to dissolve an uncured resin in a not-exposed area into the developing solution, thereby forming a relief image on the resin plate while leaving only the cured resin in an exposed area.

As a means for spraying an aqueous developing solution comprising the surfactant as the main ingredient to the plate surface of the photosensitive resin plate, spraying using a spray device is often used generally and, in addition, spraying of the developing solution using a paddle device or the like is also adopted.

In general, the spray device comprises a spray nozzle for spraying a developing solution to the plate surface of the photosensitive resin plate disposed above the liquid surface of a developer tank and a circulatory supply pump for supplying under circulation a developing solution in the developer tank to the spray nozzle.

In the existent developing method of the photosensitive resin plate adapted to blow the developing solution to the plate surface, the developing solution is degraded at a relatively small number of prepared plates, to result in the following disadvantages.

That is, the concentration of the uncured resin dissolved or dispersed in the developing solution increases up to 2 to 3% by weight at a relatively small cycles of development to lower the developing power of the developing solution, in which the uncured resin remained not being dissolved or dispersed in the developing solution is blown together with the developing solution by way of the circulatory supply pump from the spray nozzle to deposit again on the surface of the relief image, thereby degrading he image quality.

Further, while a defoamer such as silicone is added in a great amount into the developing solution of the developer tank with an aim of inhibiting generation of bubbles upon spraying the developing solution from the spray nozzle to the plate surface, an oil component contained in the silicone or the like is liberated and deposited on the plate surface and the deposited oil component repels the aqueous ink used for printing to lower the quality of the printed products.

Accordingly, in order to eliminate such drawbacks, the developing solution has been replaced at a relatively small number of prepared plates, but this not only results in lowering of the efficiency for the print making operation but also causes increase in the developing solution wastes.

Therefore, in the relevant field of art, it has been demanded for the technique capable of attaining the improvement for the efficiency of the plate making operation and decrease of the developing solution wastes by extending the life of the developing solution and increasing the number of prepared plates with a predetermined amount of the developing solution but, in order to cope with such a demand, it is necessary to minimize the oil component liberated from the defoamer such as silicone, as well as remove the uncured resin contained in the developing solution on the plate surface before the uncured resin is dissolved into the developing solution in the developer tank.

Referring more specifically, the uncured resin in the developing solution is dispersed by the function of an anionic and/or nonionic surfactant, but the uncured resin blown off the plate surface by a spray pressure upon spraying the developing solution on the plate surface is also dissolved in a not thoroughly dispersed state of oil droplets into the developing solution in the developer tank, which is blown together with the developing solution by way of the circulatory supply pump from the spray nozzle to the plate surface and re-deposited on the plate surface.

Further, referring to the defoamer, the defoamer itself tends to cause breakage of emulsion by the sharing force of an impeller of the circulatory supply pump upon passage through the impeller, so that the raw material such as silicone is liberated and suspended as oil spots in the developing solution. When they are spraying from the spray nozzle to the plate surface and deposited on the plate surface, they repel the aqueous ink used for printing and cause printing troubles.

Accordingly, it is necessary for extending the life of the developing solution to remove such uncured resin and oil spots, for example, of silicone before re-deposition on the plate surface.

As a method of removing the uncured resin or the oil component such as silicone in the developing solution, regeneration of the developing solution by distillation or filtration may be considered.

However, in the regeneration method for the developing solution by distillation under a reduced pressure, the resin component tends to adhere to a heat exchange section and, accordingly, it is necessary to previously remove a sludge-like resin component by flocculating precipitation or the like in order to prevent lowering of heat conduction efficiency in the heat exchange section, resulting in a problem that the handling of the resin is difficult.

Further, there is also a regeneration method for the developing solution using membranes such as ultra-filtration membrane, reverse osmotic membrane or ion exchange membrane. However, since the viscous uncured resin clogs the membrane, the membrane life is shortened and, accordingly, the resin component has to be removed previously by the flocculating precipitation or the like, which also results in a difficulty for the handling of the resin.

Further, in a so-called cartridge type filter of disposing a filter material as a cartridge in a developing solution supply pipe, the uncured resin in the developing solution passes through the mesh of the filter making it impossible to regenerate the developing solution.

The present invention has been accomplished in view of he background art as described above and it is an object hereof to provide a method of developing a photosensitive resin plate, as well as a developing apparatus capable of attaining the improvement for the efficiency in the plate making operation and decrease in the developing solution wastes, by minimizing an oil component liberating from a defoamer such as silicone and removing an uncured resin contained in the developing solution on the plate surface before the uncured resin is dissolved into the developing solution in the developer tank, thereby prolonging the life of the developing solution and enabling to increase the number of plates that can be developed by a predetermined amount of the developing solution.

DISCLOSURE OF THE INVENTION

For attaining the foregoing object, a method of developing a photosensitive resin plate according to the present invention is a method of developing a photosensitive resin plate adapted for supplying under circulation a developing solution stored in a developer tank and containing a surfactant to a plate surface of a photosensitive resin plate disposed above the liquid surface of the developer tank, wherein a porous sheet impregnated with a defoamer is disposed on or in the vicinity of the liquid surface of the developer tank so that the developing solution dropped from the plate surface of the photosensitive resin plate passes through the porous sheet.

Further, an apparatus for developing a photosensitive resin plate according to the present invention is an apparatus for developing a photosensitive resin plate, comprising a developer tank in which a developing solution containing a surfactant is stored, a plate support mechanism disposed above the liquid surface of the developer tank for supporting the photosensitive resin plate and a developing solution circulatory supply mechanism for supplying under circulation a developing solution in the developer tank to the plate surface of the photosensitive resin plate under circulation, wherein a porous sheet impregnated with a defoamer is disposed on or in the vicinity of the surface of the developer tank.

An anionic and/or nonionic surfactant can be used as the surfactant, a silicone resin type defoamer is preferred as the defoamer to be impregnated into the porous sheet and, further, means for supplying under circulation the developing solution to the plate surface of the photosensitive resin plate can include, for example, a spray device comprising a spray nozzle for spraying a developing solution to the surface and a circulatory supply pump for supplying under circulation a developing solution in a developer tank to the spray nozzle.

In the method of developing an aqueous development type photosensitive resin plate using the anionic and/or nonionic surfactant, when the developing solution dropping from the plate surface of the photosensitive resin plate passes through the porous sheet disposed on or in the vicinity of the liquid surface of the developer tank and impregnated with the defoamer, since the defoamer impregnated in the porous sheet is dissolved efficiently into the developing solution and the developing solution is supplied in a defoamed state to the developer tank, no cavitation occurs in the circulatory supply pump to make the defoaming effect long lasting and, further, the amount of the defoamer dissolved into the developing solution can be controlled to an optimal amount.

Further, since the amount of the defoamer can be decreased, occurrence of oil spots such as of silicone as the raw material caused by the excess amount of the defoamer can be suppressed.

Use of an oleophilic material for the porous sheet is preferred not only for making the function of the defoamer long lasting but also for removing by adsorption the uncured resin which is not sufficiently dispersed in the developing solution blown off the plate surface upon spraying the developing solution on the plate surface when the developing solution passes through the sheet.

The porous sheet in the present invention comprises a porous absorbent fabricated into a sheet and fibers (knitted products, woven or non-woven fabrics) fabricated into the sheet is preferred in view of easy for use. Further, as the material for the porous sheet, polyester, acryl, polyethylene or polypropylene which is hydrophobic and having high oleophilicity can be used. Sheet materials formed of polyethylene and/or polypropylene fibers are particularly preferred because of high oleophilicity, reduced specific weight and easy in use.

However, such fibers are not limitative but other fibers may of course be used. Further, when fibers are suspended in the developing solution, fibers may possibly deposit on the plate surface of the photosensitive resin plate to degrade the quality, so that use of fibers of long fiber length is preferred. Further, non-woven fabric made of long fibers may also be used suitably.

The density of the porous sheet is preferably 0.02 g/cm$^3$ or more in view of the absorbability and the strength and, if it is less than 0.2 g/cm$^3$, it is easy to use with less resistance in the passage of the developing solution.

As the thickness of the porous sheet, those of about 1 to 10 mm may be used as a single layer or a laminate, and it is preferred that the entire thickness is 5 cm or less in view of handling.

Further, it is effective to use a water repellent, for example, an alkyl phosphate type water repellent as an oil agent on the fiber surface of the porous sheet to provide a water repelling effect and improve the adsorption efficiency for the oil component.

The porous sheet may be fixed in the vicinity of the liquid surface in the developer tank, for example, by using a rack with a net having a net body on which a porous sheet is placed, or a tension jig for supporting the porous sheet in a state of applying a tension to the porous sheet.

Further, if the specific gravity of the porous sheet is less than 1, the porous sheet may be floated as it is on the liquid surface of the developer tank, or ends of the porous sheet may be pulled slightly and fixed by a tension jig. Further, a reinforcing material may be extended through the porous sheet itself and secured in the vicinity of the liquid surface or, alternatively, ends of the porous sheet, if it is rigid, may be fixed to the developer tank.

If the porous sheet is disposed too far from the liquid surface in the developer tank, the developing solution causes bubbling by impact shocks upon falling into the developer tank to lower the defoaming effect, so that it is disposed in the vicinity of the liquid surface, in which it is preferably disposed at or within 20 cm above the surface of the liquid surface, or within 5 cm below the liquid surface when it is disposed below the liquid surface. In a range of the liquid surface area in the developer tank the porous sheet preferably covers the entire area that the developing solution can pass through, and it is effective to use the sheet at such a size as covering at least 80% or more of the liquid surface area that the developing solution can pass through, in order to control the amount of the developing solution flowing without passing through the porous sheet.

Upon passage of the developing solution through the porous sheet, if the developing solution is passed under pressure, mesh of the porous sheets is expanded, or the developing solution after passing the porous sheet tends to cause bubbling when it returns to the atmospheric pressure, so that it is preferred that the developing solution is passed through the porous sheet without pressurization but instead passed by its own weight and the gravitational force of the solution.

As a method of impregnating the defoamer into the porous sheet, the defoamer may be impregnated previously to the fibers used for the porous sheet, but a method of uniformly impregnating a defoamer diluted properly over the entire sheet surface in a state of disposing the porous sheet in the developer tank, in the step of preparing the developing solution, or a method of impregnating a properly diluted defoamer uniformly over the entire surface of the porous sheet in the step of preparing the developing solution and then disposing the impregnated sheet in the developer tank is simple and convenient and preferred.

For the surfactant as the main ingredient of the developing solution, an anionic surfactant or a nonionic surfactant may be used either individually or in combination of them.

Typical examples of the anionic surfactant can include, for example, linear alkyl benzene sulfonic acid, α-olefin sulfonic acid, dialkyl sufosuccinic acid, sulfonic acid of fatty acid lower alkyl ester, alkyl sulfuric acid, alkyl ether sulfuric acid, saturated or unsaturated fatty acid, or alkali metal salt such as sodium or potassium salt of polyoxyalkylene adduct thereof, and salt of ammonium or alkanol amine such as monoethanolamine and diethanolamine thereof.

Further, the nonionic surfactant can include, for example, polyoxyalkylene alkyl or alkenyl ether, or terminal alkylation product thereof, polyoxyalkylene alkyl or alkenyl phenol ether or terminal alkylation product thereof, polyoxyalkylene alkyl or alkenyoxide/propylene oxide block addition product (pluronic type surfactant).

As the photosensitive resin for the photosensitive resin plate, a liquid photosensitive resin plate containing a prepolymer having reactive double bonds at the terminal end (for example, unsaturated polyurethane prepolymer) is particularly preferred for obtaining the function and the effect of the present invention.

BEST MODE FOR PRACTICING THE INVENTION

A mode of practicing the present invention is to be explained with reference to the drawings.

Figure 1:
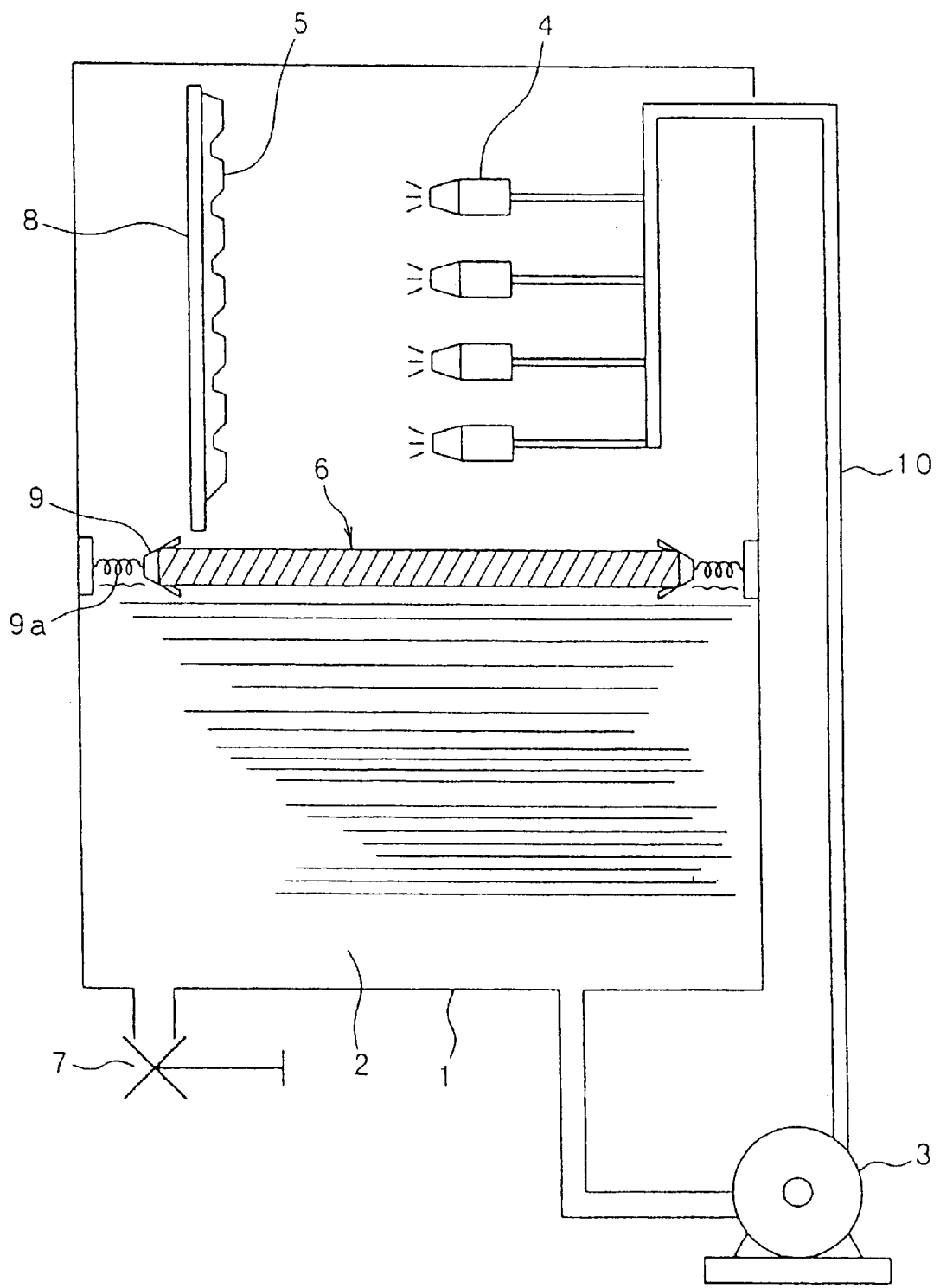
FIG. 1 is a schematic explanatory view for explaining a developing apparatus used for a developing method of a photo sensitive resin plate as a first embodiment according to the present invention.

Referring at first to a developing apparatus used in a developing method for a photosensitive resin plate as a first embodiment of the present invention, the developing apparatus comprises, as shown in FIG. 1, a developer tank 1 containing a developing solution 2 comprising a defoamer surfactant as a main ingredient, a plate support mechanism 8 for supporting a photosensitive resin plate 5 after completion of exposure disposed above the liquid surface of the developer tank 1, a developing solution circulatory supply mechanism for supplying under circulation a developing solution in the developer tank 1 to the plate surface of the photosensitive resin plate 5 and a porous sheet 6 disposed in the vicinity of the liquid surface of the developer tank 1 for allowing the developing solution 2 dropped from the photosensitive resin plate 5 to pass therethrough.

The photosensitive resin plate 5 is supported vertically to the plate support mechanism 8 by way of a clamp, clip, adhesive tape or the like.

The developing solution circulatory supply mechanism comprises a spray nozzle 4 for spraying the developing solution 2 to the plate surface of the photosensitive resin plate 5, and a circulatory supply pump 3 for supplying under circulation the developing solution 1 in the developer tank 1 to the spray nozzle 4 by way of a pipeline 10.

Figure 4:
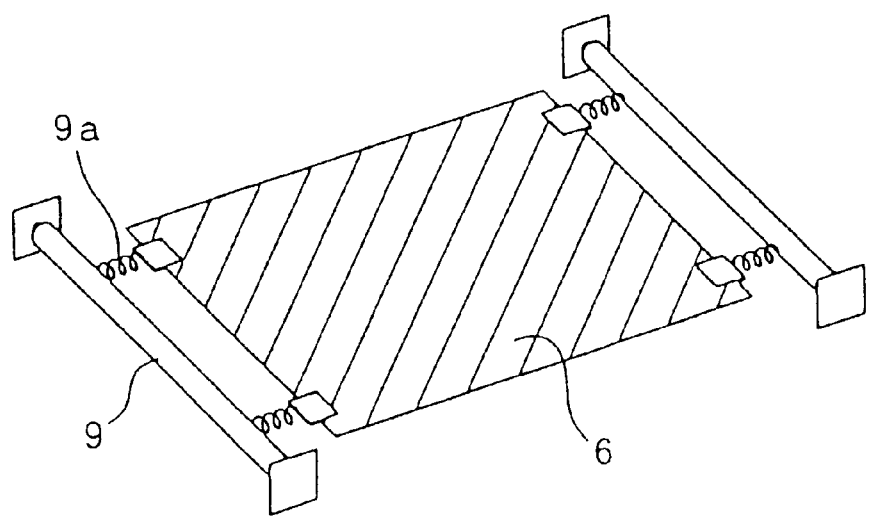
FIG. 4 is a schematic perspective view for a tension jig.

The surface of the porous sheet 6 is impregnated uniformly with a defoamer. Further, the porous sheet 6 is supported and fixed above the surface of the developing solution by a tension jig 9 attached to the inner surface of the developer tank 1 (refer to FIG. 4). In the fixed state, the porous sheet 6 is applied with a tensile force by coil springs 9a of the tension jig 9. In the drawing, reference numeral 7 denotes a drain valve for draining a degraded developing solution in the developer tank 1.

In the developing apparatus having the constitution described above, when development is started, the developing solution 2 in the developer tank 1 is blown from the spray nozzle 4 by way of the circulatory supply pump 3 and the pipeline 10 to the surface of the photosensitive resin plate 5.

When the developing solution 2 is blown to the plate surface of the photosensitive resin plate 5, uncured resin on the plate surface is dissolved in the developing solution 2, removed from the plate surface, and the developing solution 2 containing the uncured resin drops on the porous sheet 6 and passes through the porous sheet 6. In this case, a portion of the uncured resin contained in the developing solution 2 is removed by the porous sheet 6, while the defoamer impregnated in the porous sheet 6 is dissolved into the developing solution 2, and the developing solution 2 is returned under defoaming to the developer tank 1.

The developing solution 2 returned to the developer tank 1 is supplied under circulation by the circulatory supply pump 3 by way of the pipeline 10 to the spray nozzle 4 and then blown from the spray nozzle 4 to the plate surface of the photosensitive resin plate 5 in the same manner as described above. In this way, development is conducted by circulately supplying the developing solution 2 in the developer tank 1 to the plate surface of the photosensitive resin plate 5.

EXAMPLE 1

After exposing a liquid photosensitive resin plate (APR <registered trade mark> FLEX RESIN XF 729) (manufactured by Asahi Kasei Kogyo Kabushiki Kaisha) in an AWF110E exposing unit (manufactured by Asahi Kasei Kogyo Kabushiki Kaisha), 300 liter of warm water was supplied to an AWF110W developing unit (manufactured by Asahi Kasei Kogyo Kabushiki Kaisha: plate fixed vertically, spray blowing (identical constitution with the developing apparatus shown in FIG. 1)), to prepare a developing solution in which 2 wt % of APR <registered trade mark>:wash out agent XW10 (manufactured by Asahi Kasei Industry Co.) and 0.16 wt % of benzophenone dissolved in a surfactant were dissolved in the warm water.

Then, a porous sheet made of polyethylene and polypropylene fibers (5 mm thickness, 0.04 g/cm$^3$ density) was cut in accordance with the liquid surface area of the developer tank with an aim of covering the entire surface of the liquid surface, which was supported and fixed above the liquid surface of the developing solution in the developer tank by using a tension jig and then about 0.3 wt % of a silicone defoamer APR:defoamer TYPESH-4 (manufactured by Asahi Kasei Industry Co.) dissolved in water was impregnated uniformly over the entire surface of the porous sheet.

Exposure and development were conducted under the conditions described above.

In the developing process, the developing solution blown from the spray nozzle to the plate surface of the liquid photosensitive resin plate dropped from the plate surface, passed through the porous sheet, returned to the developer tank and then circulated again by the circulatory supply pump from the spray nozzle and blown to the plate surface of the liquid photosensitive resin plate. It could be confirmed that the developing solution bubbling on the surface of the porous sheet was defoamed effectively.

After repeating the development till the 12th plate (corresponding to 2 wt % concentration of the resin dissolved in the developing solution), since no degradation was observed for the developing solution, development was continued.

In the continuous development, since the developing solution was diluted with a plate washing water supplied during development, 1 wt % of the wash out agent XW10 and 0.08% by weight of benzophenone were added directly to the developer tank while turning up the end of the sheet so as not to impregnate them into the porous sheet.

After repeating exposure and development till the 24th plate, 1 wt % of the wash out agent XW10 and 0.08 wt % of benzophenone were added in the same manner as described above and, since the developing solution become bubbled, an SH-4 defoamer dissolved by 0.15% corresponding to about one-half of ordinary amount was uniformly impregnated over the entire surface of the porous sheet.

Exposure and development were further repeated and development was terminated at the 34th plate, in which neither development failure nor degradation of the developing solution was observed and the number of developed plates twice to three times as much as that in the prior art could be obtained.

After the completion of the development, the drain valve was opened to drain the developing solution in the developer tank and the porous sheet was also discarded since it was contaminated being incorporated with the oil component containing undissolved resin.

The addition amount of the wash out agent and benzophenone used in the developing process was ⅔ for the ordinary amount and the addition amount of the defoamer was also reduced to one-half of the ordinary amount, so that the material can be saved and the life of the developing solution could be extended.

Then, a developing apparatus used for the method of developing a photosensitive resin plate as a second embodiment of the present invention is to be explained with reference to FIG. 2.

The developing apparatus comprises a developer tank 11 containing a developing solution 12 comprising a defoamer surfactant as a main ingredient, a plate support mechanism 18 for supporting a photosensitive resin plate 15 after completion of exposure disposed above the liquid surface of the developer tank 11, a developing solution circulatory supply mechanism for supplying under circulation a developing solution in the developer tank 11 on the plate surface of the photosensitive resin plate 15 and a porous sheet 16 disposed in the vicinity of the liquid surface of the developer tank 1 for allowing the developing solution 12 dropping from the photosensitive resin plate 15 to pass therethrough.

The photosensitive resin plate 15 is supported on the outer circumferential surface of a drum-shaped plate support mechanism 18 with an axis being directed in a horizontal direction by way of a clamp, clip or an adhesive tape.

The developing solution circulatory supply mechanism comprises a spray nozzle 14 for spraying a developing solution to the plate surface of the photosensitive resin plate 15, and a circulatory supply pump 13 for supplying under circulation the developing solution in the developer tank 1 by way of a pipeline 20 to the spray nozzle 14.

Figure 3:
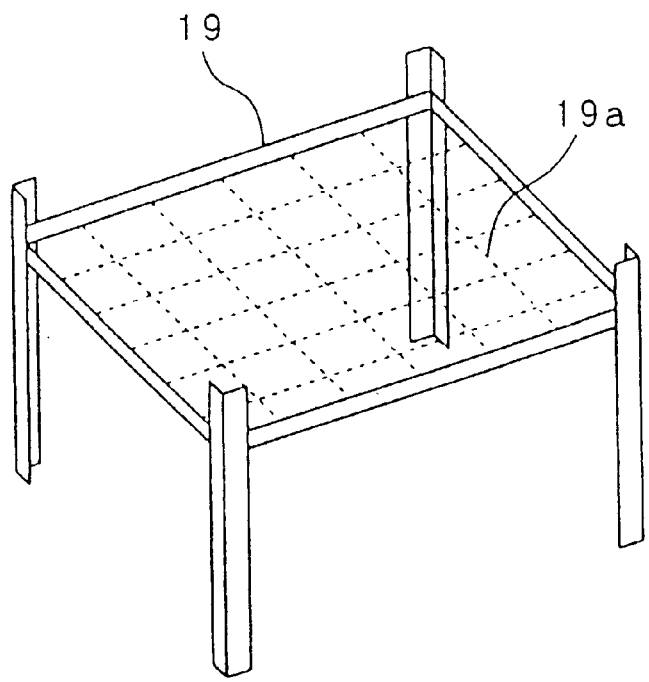
FIG. 3 is a schematic perspective view for a rack with a net.

The surface of the porous sheet 16 is uniformly impregnated with a defoamer. Further, the porous sheet 16 is placed on a net body 19a of a previously manufactured rack 19 with a net (refer to FIG. 3). The rack 19 with a net is disposed in the developer tank 1 and adjusted such that the height of the net body 19a, that is, the height of the porous sheet 16 is about 2 cm above the liquid surface of the developing solution. In the drawing, reference numeral 17 denotes a drain valve for draining the developing solution degraded in the developer tank 1.

In the developing apparatus having the constitution described above, when development is started, the developing solution 12 in the developer tank 11 is blown from the spray nozzle 14 by way of the circulatory supply pump 13 and the pipeline 20 to the surface of the photosensitive resin plate 15.

When the developing solution 12 is blown to the plate surface of the photosensitive resin plate 15, uncured resin on the plate surface is dissolved in the developing solution 12, removed from the plate surface, and the developing solution 12 containing the uncured resin drops on the porous sheet 16 and passes through the porous sheet 16. In this case, a portion of the uncured resin contained in the developing solution 12 is removed by the porous sheet 16, while the defoamer impregnated in the porous sheet 16 is dissolved in the developing solution 12, and the developing solution 12 is returned under defoaming to the developer tank 11.

The developing solution 12 returned to the developer tank 11 is supplied under circulation by the circulatory supply pump 13 by way of the pipeline to the spray nozzle 14 and then blown from the spray nozzle 14 to the plate surface of the photosensitive resin plate 15 in the same manner as described above. In this way, development is conducted by supplying under circulation the developing solution 12 in the developer tank 11 to the plate surface of the photosensitive resin plate 15.

EXAMPLE 2

Figure 2:
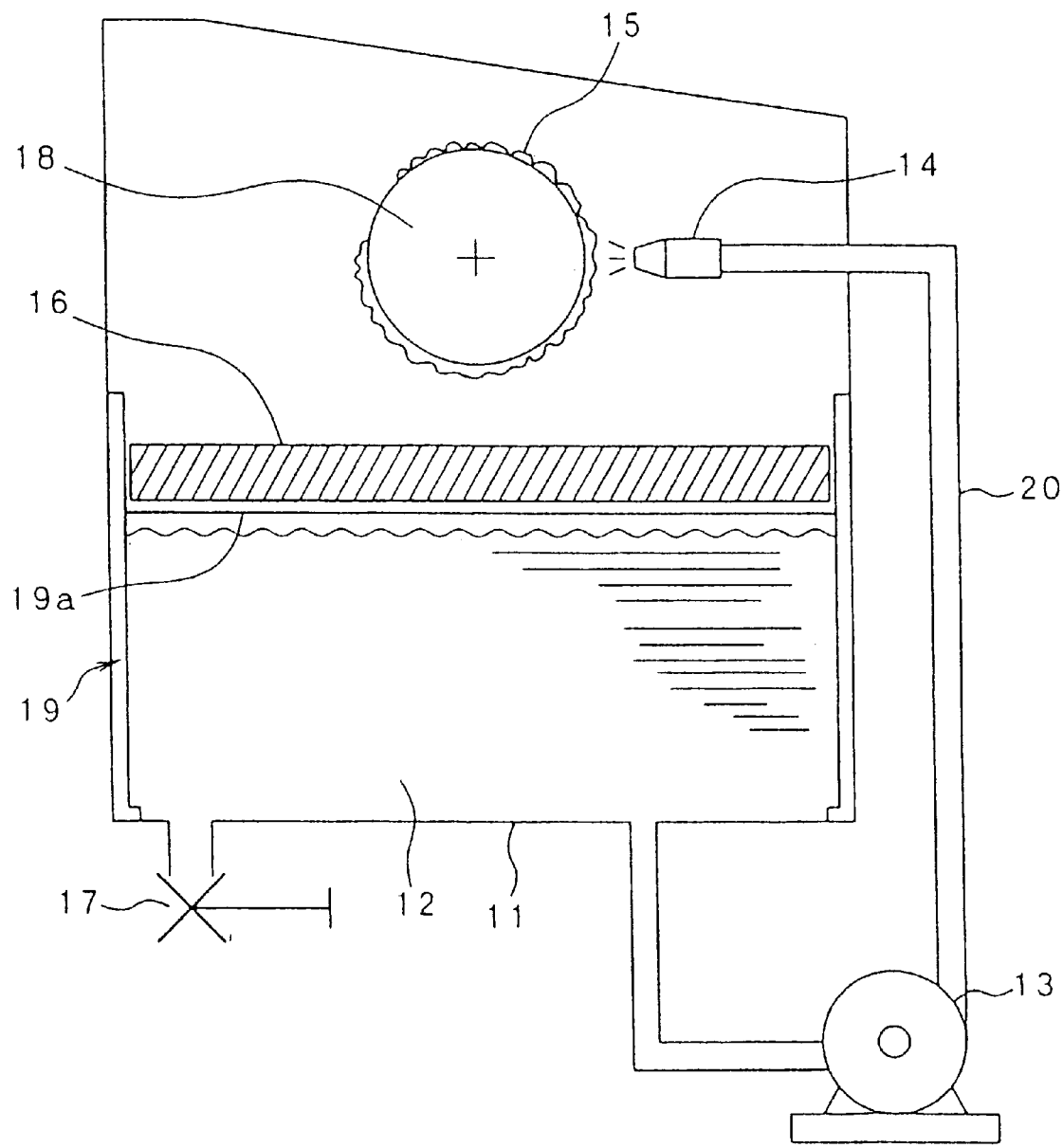
FIG. 2 is a schematic explanatory view for explaining a developing apparatus used for a developing method of a photo sensitive resin plate as a second embodiment according to the present invention.

After exposing a liquid photosensitive resin plate (APR <registered trade mark> FLEX RESIN XF 729) (manufactured by Asahi Kasei Industry Co.) by an ALF213E exposing unit (manufactured by Asahi Kasei Industry Co.), 60 liter of warm water was supplied to an AL400W developing unit (manufactured by Asahi Kasei Industry Co.:fixed on plate drum vertically, spray blowing (identical constitution with the developing apparatus shown in FIG. 2)), to prepare a developing solution in which 2 wt % of APR <registered trade mark>:wash out agent XW10 (manufactured by Asahi Kasei Industry Co.) and 0.16 wt % of benzophenone dissolved in a surfactant were dissolved in the warm water.

A rack with a net manufactured previously for fixing the porous sheet was placed in the developer tank, a porous sheet was placed on the net body of the rack with a net and adjusted such that the height of the net body was about 2 cm above the liquid surface of the developing solution. The net body of the rack with a net is dimensioned to such a size as covering the entire liquid surface of the developing solution and, accordingly, the porous sheet was also sized so as to cover the entire surface of the developing solution.

Then, about 0.3 wt % of a defoamer APR defoamer TYPESH-4 (manufactured by Asahi Kasei Industry Co.) dissolved in water was impregnated uniformly over the entire surface of the porous sheet (made of polyethylene, polypropylene, 5 mm thickness and 0.04 g/cm$^3$ density).

Exposing and developing operation was conducted under the conditions in the same manner as in the first embodiment described previously.

In the developing process, the developing solution blown from the spray nozzle to the plate surface of the liquid photosensitive resin plate dropped from the plate surface, passed through the surface of the porous sheet, returned into the developer tank and then circulated again by the circulatory supply pump from the spray nozzle and blown to the plate surface of the liquid photosensitive resin plate, and it could be confirmed that the developing solution bubbled on the surface of the porous sheet was defoamed effectively.

After repeating development till the 12th plate (corresponding to 2 wt % concentration of the resin dissolved in the developing solution), since no degradation for the developing solution was observed, developing was continued.

In the continuous development, since the developing solution was diluted with a plate washing water supplied during development, 1 wt % of the wash out agent XW10 and 0.08 wt % of benzophenone were added directly to the developer tank while turning up the end of the sheet so as not to impregnate them into the porous sheet.

After repeating exposure and development till the 24th plate, 1 wt % of the wash out agent XW10 and 0.08 wt % of benzophenone were added in the same manner as described above. Since the developing solution became bubbled, an SH-4 defoamer dissolved by 0.15% corresponding to about one-half of the ordinary amount was uniformly impregnated over the entire surface of the porous sheet.

Exposure and development were further repeated and development was terminated at the 48th plate in which neither development failure nor degradation of the developing solution was observed and the number of developed plates twice to three times as much as that in the prior art could be obtained.

The addition amount of the wash out agent or benzophenone used in the developing process was 2.5/4 for the ordinary amount and the addition amount of the defoamer was also 1.5/4 for the ordinary amount, so that the material can be saved and the life of the developing solution can be extended.

Figure 5:
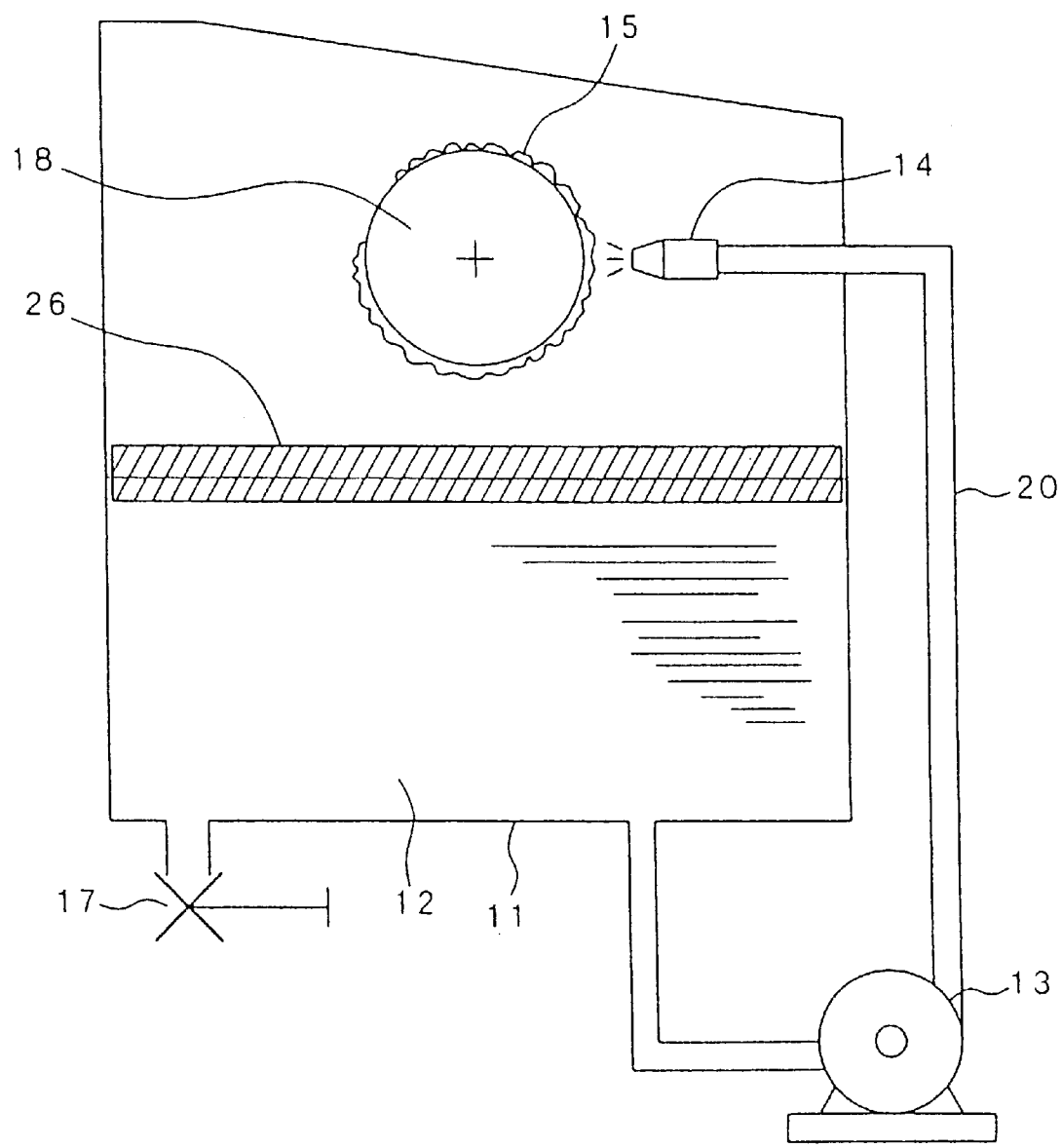
FIG. 5 is a schematic explanatory view for explaining a developing apparatus used for a developing method of a photo sensitive resin plate as a third embodiment according to the present invention

FIG. 5 is a developing apparatus used for the method of developing a photosensitive resin plate as a third embodiment of the present invention. Since the constitution and the function and effect of this developing apparatus are identical with those of the second embodiment described above excepting that a porous sheet 26 made of polyethylene and polypropylene having a specific gravity of less than 1 was not fixed but floated on the surface of the developing solution in the developer tank 11, identical numericals are shown in the drawing while saving explanation therefor.

EXAMPLE 3

When exposure and development were conducted for the liquid photosensitive resin plate under the same conditions as those in Example 2 excepting that a porous sheet made of polyethylene and polypropylene with a specific gravity of less than 1 was not fixed but floated on the liquid surface of the developing solution of the developer tank, neither developing failure nor degradation of the developing solution was observed and a number of developed plates twice to three times as much as that in the prior art could be obtained.

INDUSTRIAL APPLICABILITY

As apparent from the foregoing explanations, according to the present invention, since the number of plates developable by a predetermined amount of a developing solution can be increased by greatly extending the service life of the developing solution, it is possible to obtain the effect capable of attaining the improvement in the efficiency in the plate making operation and decrease in the amount of developing solution wastes.

What is claimed is:

1. A method of developing a photosensitive resin plate adapted for supplying under circulation a developing solution stored in a developer tank and containing a surfactant to the plate surface of a photosensitive resin plate disposed above the liquid surface of the developer tank, wherein, a porous sheet impregnated with a defoamer is disposed at or in the vicinity of the liquid surface of the developer tank such that the developing solution dropping from the plate surface of the photosensitive resin plate is allowed to pass through the porous sheet.

2. A method of developing a photosensitive resin plate as defined in claim 1, wherein the surfactant is an anionic and/or nonionic surfactant.

3. A method of developing a photosensitive resin plate as defined in claim 1 or 2, wherein supply of the developing solution to the plate surface of the photosensitive resin plate is conducted by spraying.

4. An apparatus for the developing a photosensitive resin plate having a developer tank for storing a developing solution containing a surfactant, a plate support mechanism for supporting a photosensitive resin plate disposed above the liquid surface of the developer tank and a developing solution circulatory supply mechanism for supplying under circulation a developing solution in the developer tank to the plate surface of the photosensitive resin plate, wherein a porous sheet impregnated with a defoamer is disposed on or in the vicinity of the liquid surface of the developer tank.

5. An apparatus for developing a photosensitive resin plate as defined in claim 4, comprising a rack with a net having a net body on which the porous sheet is placed, or a tension jig for supporting and fixing the porous sheet in a state of exerting a tensile force to the porous sheet.

* * * * *